United States Patent
Lu et al.

(10) Patent No.: US 10,998,071 B2
(45) Date of Patent: *May 4, 2021

(54) SYSTEMS AND METHODS TO TEST A MEMORY DEVICE

(71) Applicant: Taiwan Semiconductor Manufacturing Co., Ltd., Hsinchu (TW)

(72) Inventors: Shih-Lien Linus Lu, Hsinchu (TW); Johnathan Tsung-Yung Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/889,686

(22) Filed: Jun. 1, 2020

(65) Prior Publication Data

US 2020/0365223 A1 Nov. 19, 2020

Related U.S. Application Data

(63) Continuation of application No. 16/681,703, filed on Nov. 12, 2019, now Pat. No. 10,672,494, which is a
(Continued)

(51) Int. Cl.
*G11C 29/02* (2006.01)
*G11C 17/18* (2006.01)
(Continued)

(52) U.S. Cl.
CPC .......... *G11C 29/024* (2013.01); *G11C 17/146* (2013.01); *G11C 17/16* (2013.01);
(Continued)

(58) Field of Classification Search
CPC ..... G11C 29/024; G11C 17/146; G11C 17/16; G11C 17/18; G11C 29/12; G11C 2029/2602; G11C 2029/4402; G11C 11/04
See application file for complete search history.

(56) References Cited

U.S. PATENT DOCUMENTS 6,687,867 B2 2/2004 Ni
7,065,689 B2 6/2006 Chiu
(Continued)

*Primary Examiner* — Tri M Hoang
(74) *Attorney, Agent, or Firm* — Duane Morris LLP

(57) ABSTRACT

A memory device, includes: a memory array comprising a plurality of bit cells arranged along a plurality of rows and along a plurality of columns, respectively; and a control logic circuit coupled to the memory array, and configured to determine respective locations of a first plurality of diagonal bit cells of the memory array for testing one or more peripheral circuits coupled to the memory array, wherein the control logic circuit is further configured to determine respective locations of at least a second plurality of diagonal bit cells of the memory array for testing the one or more peripheral circuits, wherein a number of the plurality of rows is different than a number of the plurality of columns and the first plurality of diagonal bit cells span a first equal number of rows and columns and the second plurality of diagonal bit cells also span a second equal number of rows and columns.

20 Claims, 11 Drawing Sheets

Related U.S. Application Data continuation of application No. 15/965,456, filed on Apr. 27, 2018, now Pat. No. 10,504,604.

(60) Provisional application No. 62/564,631, filed on Sep. 28, 2017.

(51) Int. Cl.
*G11C 17/16* (2006.01)
*G11C 17/14* (2006.01)
*G11C 29/12* (2006.01)
G11C 29/44 (2006.01)
G11C 29/26 (2006.01)

(52) U.S. Cl.
CPC .............. *G11C 17/18* (2013.01); *G11C 29/12* (2013.01); *G11C 2029/2602* (2013.01); *G11C 2029/4402* (2013.01)

(56) References Cited

U.S. PATENT DOCUMENTS

| | | |
|---|---|---|
| 7,415,646 B1 | 8/2008 | Lee |
| 7,620,792 B2 | 11/2009 | Maupin |
| 7,646,655 B2 | 1/2010 | Mondello |
| 8,917,533 B2 | 12/2014 | Chung |
| 10,504,604 B2 | 12/2019 | Lu |
| 10,672,494 B2 * | 6/2020 | Lu .......................... G11C 29/12 |
| 2008/0046677 A1 | 2/2008 | Maupin |

\* cited by examiner

SYSTEMS AND METHODS TO TEST A MEMORY DEVICE

CROSS-REFERENCE TO RELATION APPLICATION

This application is a continuation application of U.S. patent application Ser. No. 16/681,703, filed Nov. 12, 2019, now U.S. Pat. No. 10,672,494, which is a continuation application of U.S. patent application Ser. No. 15/965,456, filed Apr. 27, 2018, now U.S. Pat. No. 10,504,604, which claims priority to U.S. Provisional Patent Application No. 62/564,631, filed on Sep. 28, 2017, each of which is incorporated by reference herein in its entirety.

BACKGROUND

Due to ever increasingly need for high-performance and low-cost non-volatile memory devices, new types of non-volatile memory devices have emerged such as, magnetic random-access memory (MRAM) devices, resistive random-access memory (RRAM) devices, phase change memory (PCM) devices, and write-once memory (WOM) devices. Among those emerging non-volatile memory devices, the WOM devices (e.g., eFuse devices, anti-Fuse devices, one-time programmable devices, etc.) have gained particular interests since the WOM devices offer various advantages, for example, low manufacturing cost, etc. In addition, as the WOM device typically allows data to be written only once (i.e., the WOM device is non-reversible once written), the WOM device can be used for security purposes, e.g., to permanently store key chip information such as chip/manufacture ID, access codes and error maps.

In conventional memory devices, for example, static random-access memory (SRAM) devices or dynamic random-access memory (DRAM) devices, memory cells of the memory device are typically tested through writing a data pattern (i.e., a pattern of data bits) to the memory cells and then reading a respective written data bit from each of the memory cells. Because of such a non-reversible characteristic, the WOM device cannot be tested like conventional memory devices. Typically, the WOM device includes a plurality of dummy memory cells for test purposes. In particular, each memory cell of the WOM device uses one or more dummy memory cells as respective spares, each of which is configured to store a same data bit. As such, even though an original memory cell is malfunctioning under a test mode, the original memory cell's spare(s) can be used (e.g., to replace the original one) as so to allow a reliable operation of the WOM device, as a whole.

To assure that each memory cell of the WOM device receives a fair test (i.e., a correct test) under the above-mentioned test mode, typically, peripheral circuits (e.g., a column decoder, a row decoder, etc.) of the WOM devices are also tested. In conventional WOM devices, at least a whole row of the memory cells are written to test the column decoder, and at least a whole column of the memory cells are written to test the row decoder. Since the memory cells of the WOM device are allowed to be written only once, after being written, the memory cells become "unusable," also known as "burned." Burning the whole row and column of memory cells wastes "usable" memory cells in the conventional WOM device. Thus, conventional ways of testing the WOM devices are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
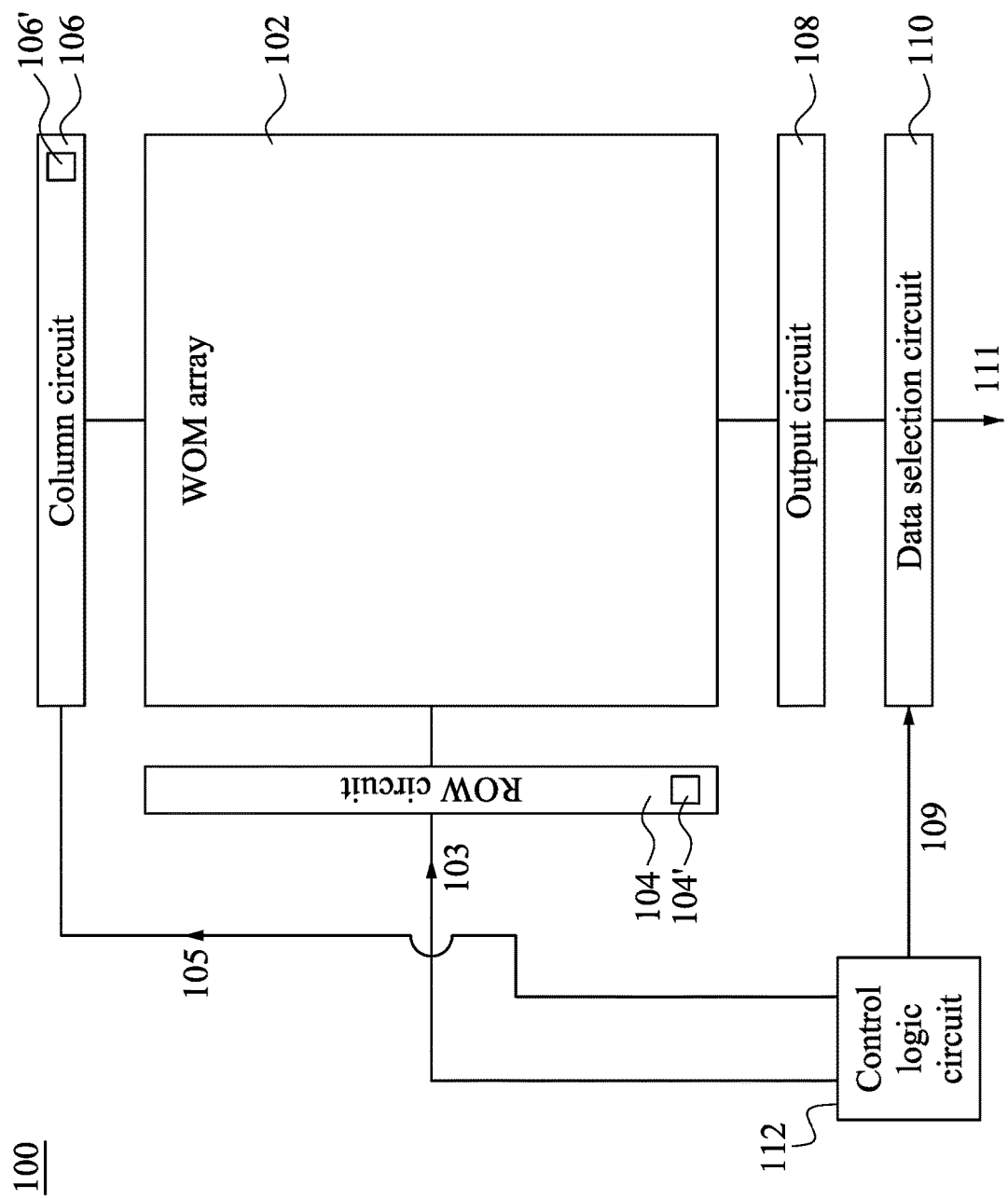
FIG. 1 illustrates a block diagram of a novel write-once memory (WOM) device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel write-once memory (WOM) device including a control logic circuit that is configured to test peripheral circuits (e.g., row and column decoders) of the WOM device using a minimum number of bit cells of the WOM device. As mentioned above, conventional WOM device burns at least a whole column and a whole row of bit cells of the WOM device to test its respective peripheral circuits. In contrast, the control logic circuit of the novel WOM device burns respective diagonal bit cells to test its row and column decoders, according to some embodiments of the present disclosure. In other words, only the bit cells disposed along diagonal direction(s) of a respective bit cell array of the novel WOM device are burned to test the row and column decoders. As such, the number of the bit cells in the novel WOM device that will be burned (i.e., the bit cells that will become unusable) may be substantially reduced. For example, in a conventional WOM device having a 10×10 bit cell array, at least 20 bit cells are burned to test respective row and column decoders of the WOM device. However, in the novel WOM device, which also includes a 10×10 bit cell array, only 10 bit cells disposed along a diagonal of the bit cell array are burned to test respective row and column decoders.

FIG. 1 illustrates a block diagram of a novel WOM device 100, in accordance with various embodiments. The WOM device 100 includes a WOM array 102, a row circuit 104, a column circuit 106, an output circuit 108, a data selection circuit 110, and a control logic circuit 112. In some embodiments, the control logic circuit 112 includes a built-in self-test (BIST) circuit, and is coupled to the row circuit 104, the column circuit 106, and the data selection circuit 110 to provide respective address and/or control information, which will be discussed in further detail below.

The WOM array 102 includes a plurality of WOM bit cells (e.g., eFuse bit cells, anti-Fuse bit cells, one-time programmable bit cells, etc.) arranged as an array. In other words, the WOM array 102 includes the plurality of WOM bit cells (hereinafter "bit cells") arranged in a column-row configuration, wherein each bit cell is associated with a respective combination of a "row address" and a "column address," and can be localized using the respective combination of the row and column addresses. It is noted that respective numbers of column and rows of the WOM array 102 may be equal to or different from each other, which will be illustrated and discussed below with respect to FIGS. 2A, 2B, and 2C.

The row circuit 104 is coupled to the WOM array 102. More specifically, the row circuit 104 is coupled to the plurality of bit cells of the array 102 through respective WL's, each of which is associated with a respective row address (i.e., each WL is disposed along a respective row with a respective row address). In some embodiments, the row circuit 104 may include at least one row decoder 104'. The row decoder 104' is configured to receive row address information 103 from the control logic circuit 112 indicating a row address, and based on the row address, the row decoder 104' asserts a corresponding WL (i.e., a corresponding row) so as to activate respective bit cells arranged along that asserted row/WL.

Further, in some embodiments, the row circuit 104 may include plural sub row circuits (e.g., a combination of plural logic gates) with a total number equal to a number of rows of the WOM array 102. For purposes of clarity of illustration, the sub row circuits are not shown in FIG. 1. Each sub row circuit is coupled to a respective row, and configured to assert a corresponding WL along the respective row. In accordance with some embodiments, each of the sub row circuits of the row circuit 104 is tested to assure that the row circuit 104 functions properly using a correct and properly functional sub row circuit to assert a correct row as instructed by the row address information 103. As such, a subsequent test to test whether each of the bit cells of the WOM array 102 functions properly can be trusted.

Similarly, the column circuit 106 is coupled to the WOM array 102. More specifically, the column circuit 106 is coupled to the plurality of bit cells of the WOM array 102 through respective BL's, each of which is associated with a respective column address (i.e., each BL is disposed along a respective column with a respective column address). In some embodiments, the column circuit 106 includes at least one column decoder 106'. The column decoder 106' is configured to receive column address information 105 from the control logic circuit 112 indicating a column address, and based on the column address, the column decoder 106' asserts a corresponding BL (i.e., a corresponding column) so as to activate respective bit cells arranged along that asserted column/BL.

In some embodiments, the control logic circuit 112 may first cause the row circuit 104 to assert a row by indicating a row address in the row address information 103 so as to activate all bit cells along that asserted row, and then cause the column circuit 106 to pick one of the bit cells along the asserted row by indicating a column address in the column information 105. As such, a combination of a row address and a column address can be used to pick a corresponding bit cell in the WOM array 102. In some alternative embodiments, the control logic circuit 112 may first cause the column circuit 106 to assert a column by indicating a column address in the column address information 105 so as to activate all bit cells along that asserted column, and then cause the row circuit 104 to pick one of the bit cells along the asserted column by indicating a row address in the row address information 103 while remaining within the scope of the present disclosure.

Further, in some embodiments, the column circuit 106 may include plural sub column circuits (e.g., a combination of plural logic gates) with a total number equal to a number of columns of the WOM array 102. For purposes of clarity of illustration, the sub column circuits are not shown in FIG. 1. Each sub column circuit is coupled to a respective column, and configured to assert a corresponding BL along the respective column. In accordance with some embodiments, each of the sub column circuits of the column circuit 106 is tested to assure that the column circuit 106 functions properly using a correct and properly functional sub column circuit to pick a correct column as instructed by the column address information 105. As such, the subsequent test to test whether each of the bit cells of the WOM array 102 functions properly can be trusted.

Figure 2A:
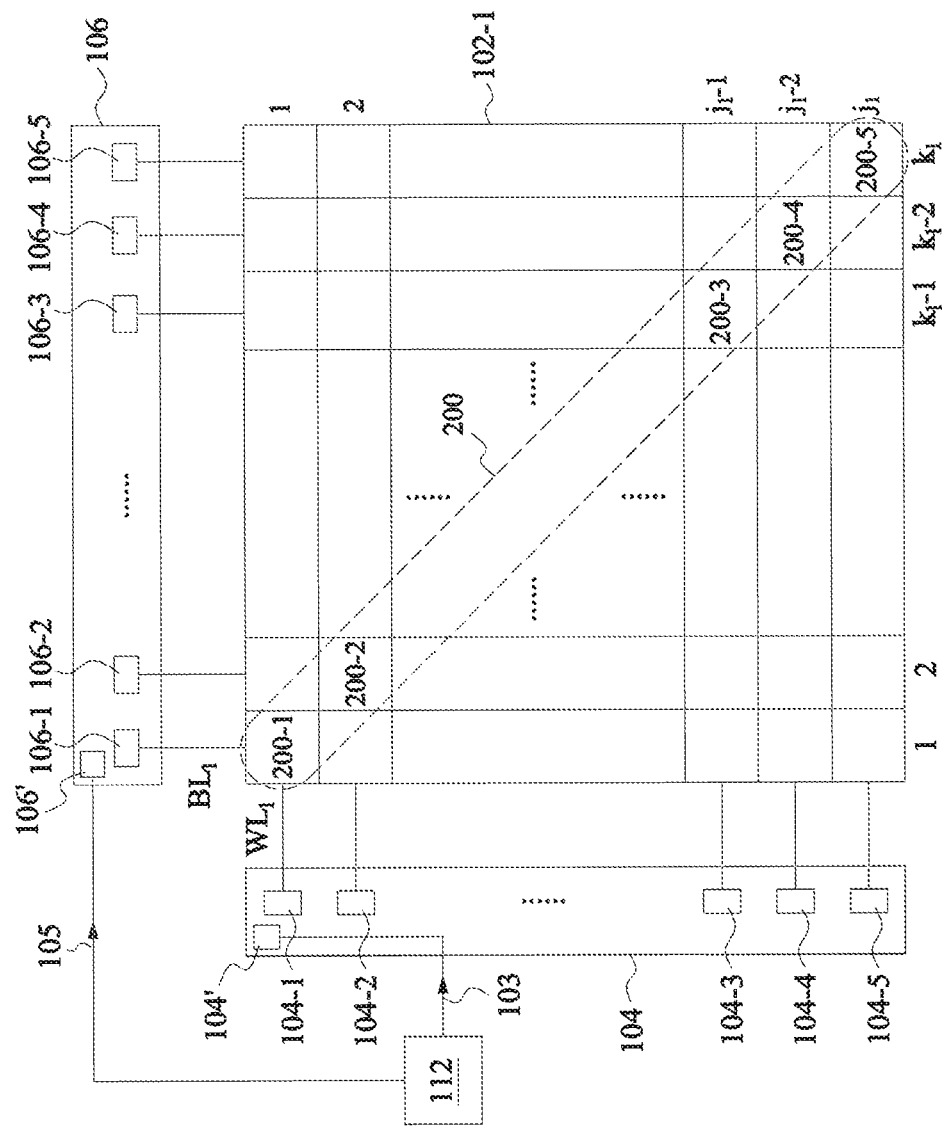
FIGS. 2A, 2B, and 2C illustrate respective block diagrams of part of the WOM device of FIG. 1 when an included WOM array is implemented by respective different configurations, in accordance with some embodiments.
Figure 2B:
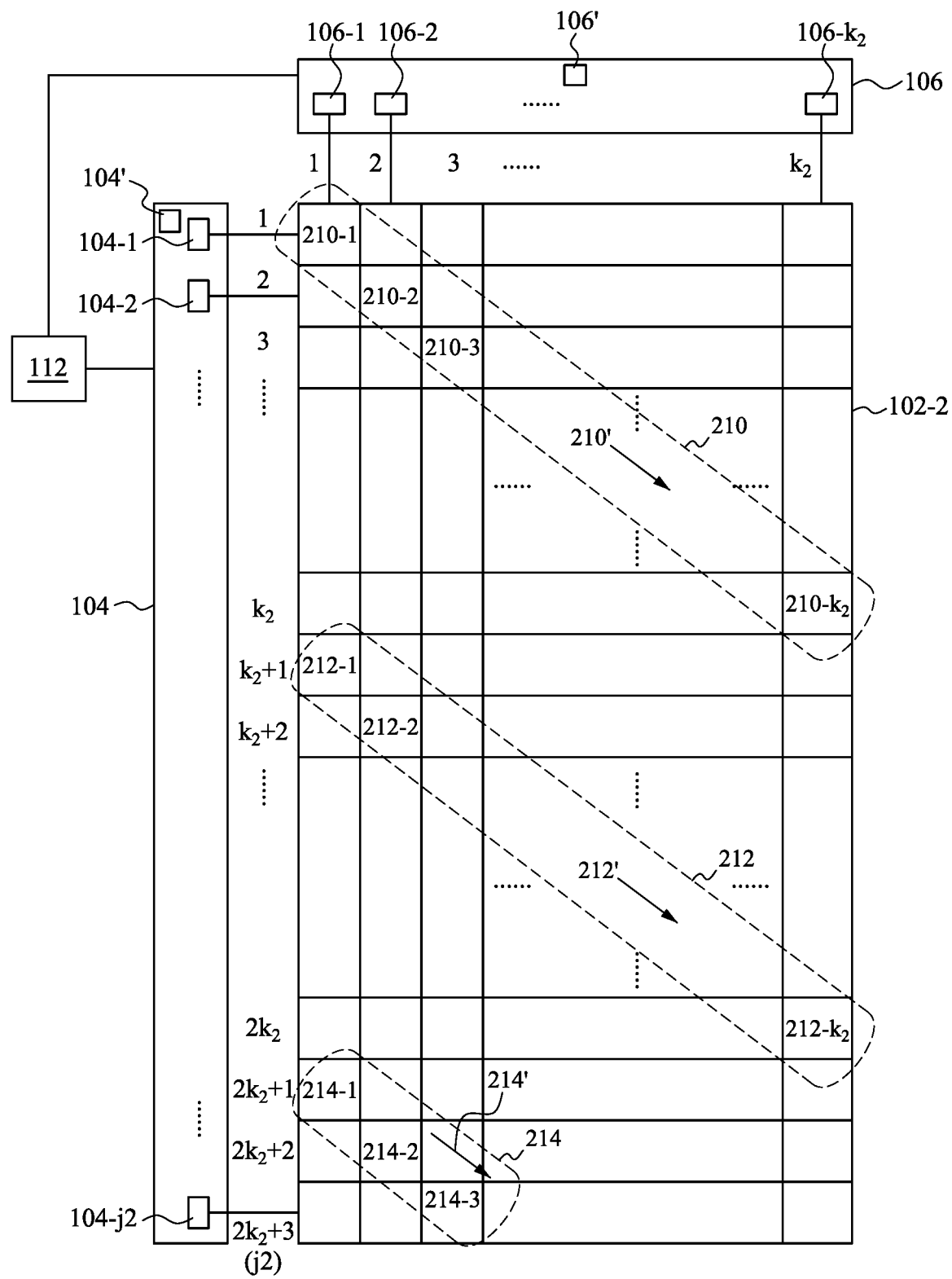
Figure 2C:
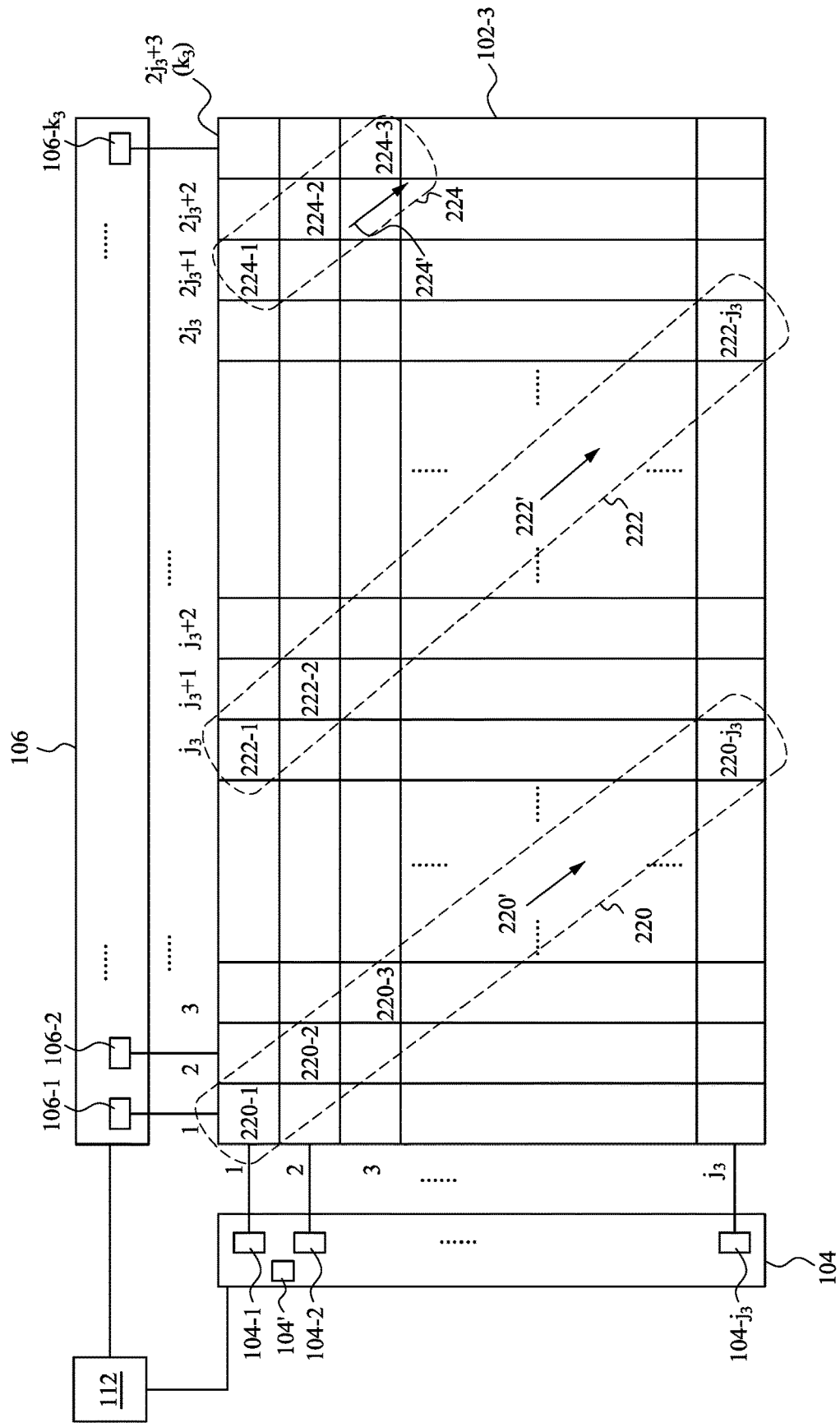

In some embodiments, each of the sub row circuits of the row circuit 104 and a corresponding one of the sub column circuits of the column circuit 106 may be, concurrently or respectively, tested by burning a diagonal bit cell of the WOM array 102 whose location (i.e., row and column addresses) is determined, by the control logic circuit 112, based on a corresponding row address of the sub row circuit of the row circuit 104 and a configuration of the WOM array 102, which will be discussed with respect to FIGS. 2A-2C. Further, details of determining the location of such a diagonal bit cell of the WOM array 102 will be discussed in further detail below.

The output circuit 108, coupled to the WOM array 102, is configured to read out logic states of each of the bit cells of the WOM array 102. In some embodiments, the output circuit 108 may include a plurality of column multiplexers (not shown), sensing amplifiers (not shown), etc. The column multiplexer of the output circuit 108 is configured to select a smaller number of columns to be read from a larger number of columns, and the sensing amplifier of the output circuit 108 is configured to determine respective logic states of the bit cells of the WOM array 101 by sensing either voltage or current levels present on corresponding BL's, which are understood by persons of ordinary skill in the art. Thus, details of the column multiplexers and sensing amplifiers of the output circuit 108 are not repeated here.

The data selection circuit 110, coupled to the output circuit 108 and the control logic circuit 112, is configured to determine which of the bit cells of the WOM array 102 can be skipped to provide its respective logic state. As mentioned above, a diagonal bit cell is burned to test corresponding sub row circuit of the row circuit 104 and sub column circuit of the column circuit 106 such that the diagonal bit cell becomes unusable. In some embodiments, based on a signal 109 provided by the control logic circuit 112, the data selection circuit 110 is configured to skip outputting respective logic states of the unusable bit cells, and outputs logic states of "usable" bit cells (i.e., bit cells are not burned) as an output signal 111. In some embodiments, the signal 109 may be determined based on which of the rows in the WOM array 102 are currently accessed (e.g. read) by the output circuit 108, and/or the configuration of the WOM array 102. Operations of the data selection circuit 110 will be discussed in further detail below with respect to FIGS. 4A, 4B, 5A, 5B, and 5C.

FIGS. 2A, 2B, and 2C illustrate respective block diagrams of part of the WOM device 100 when the WOM array 102 is implemented by respective different configurations, in accordance with some embodiments. As mentioned above, the WOM array 102 includes plural bit cells arranged in the column-row configuration, wherein the respective numbers of rows and columns may be configured as equal to or different from each other.

In some embodiments, FIG. 2A illustrates an exemplary configuration of the WOM array 102 having the number of rows (hereinafter "j i") and the number of columns (hereinafter "$k_1$") equal, i.e., $j_1=k_1$, (hereinafter "WOM array 102-1"); FIG. 2B illustrates another exemplary configuration of the WOM array 102 having more rows (in a number of "$j_2$") than columns (in a number of "$k_2$"), $j_2<k_2$, (hereinafter "WOM array 102-2"); and FIG. 2C illustrates another exemplary configuration of the WOM array 102 having more columns (in a number of "$k_3$") than rows (in a number of "$j_3$"), i.e., $j_3<k_3$, (hereinafter "WOM array 102-3").

According to some embodiments, since the control logic circuit 112 uses the respective configuration of the WOM array 102-1, 102-2, and 102-3 to determine which of the bit cells in the respective WOM array is or are to be burned for testing the row circuit 102 and column circuit 106, the WOM arrays 102-1, 102-2 and 102-3 of FIGS. 2A, 2B, and 2C are respectively used to illustrate how the control logic circuit 112 makes such a determination in accordance with the respective different configuration of the WOM arrays 102-1, 102-2, and 102-3 in the following discussion.

Referring first to the WOM array 102-1 FIG. 2A where the numbers of the respective rows and columns are equal ($j_1=k_1$), the control logic circuit 112 burns a set of diagonal bit cells 200 of the WOM array 102-1 to test the row circuit 104 and the column circuit 106, in accordance with some embodiments. In some embodiments, when $j_1=k_1$, the control logic circuit 112 first determines that the set of diagonal bit cells 200 are the bit cells along a main diagonal in the WOM array 102-1 that span from a first row ("row 1") to a last row ("row $j_1$") and from a first column ("column 1") to a last column ("column $k_1$"). As such, each of the set of diagonal bit cells 200 has respective row and column addresses equal.

For example, the set of diagonal bit cells 200 include: diagonal bit cells 200-1, 200-2, 200-3, 200-4, and 200-5. It is understood that one or more diagonal bit cells may be included in the set of diagonal bit cells 200 while remaining within the scope of the present disclosure. Among the set of diagonal bit cells 200, the diagonal bit cell 200-1 is disposed at an intersection of row 1 and column 1 of the WOM array 102-1 thereby having a respective address combination of row and column addresses (hereinafter "address combination") as (1, 1); the diagonal bit cell 200-2 is disposed at an intersection of a second row ("row 2") and a second column ("column 2") of the WOM array 102-1 thereby having a respective address combination as (2, 2); the diagonal bit cell 200-3 is disposed at an intersection of a $j_1$-$2^{th}$ row ("row $j_1$-2") and a $k_1$-$2^{th}$ column ("column $k_1$-2") of the WOM array 102-1 thereby having a respective address combination as ($j_1$-2, $k_1$-2); the diagonal bit cell 200-4 is disposed at an intersection of a $j_1$-$1^{th}$ row ("row $j_1$-1") and a $k_1$-$1^{th}$ column ("column $k_1$-1") of the WOM array 102-1 thereby having a respective address combination as ($j_1$-1, $k_1$-1); and the diagonal bit cell 200-5 is disposed at an intersection of row $j_1$ and column $k_1$ of the WOM array 102-1 thereby having a respective address combination as ($j_1$, $k_1$).

In some embodiments, after the control logic circuit 112 determines the respective location (i.e., the respective address combination) of each of the set of diagonal bit cells 200 in the WOM array 102-1, the control logic circuit 112 tests the above-mentioned sub row circuits (e.g., 104-1, 104-2, 104-3, 104-4, 104-5, etc.) of the row circuit 104 and sub column circuit (e.g., 106-1, 106-2, 106-3, 106-4, 106-5, etc.) of the column circuit 106, concurrently or respectively, by burning the set of diagonal bit cells 200.

For example, in some embodiments, the control logic circuit 112 provides the address combination of the diagonal bit cell 200-1, i.e., (1, 1), in row address information 103 and column address information 105 to the row decoder 104' and the column decoder 106', respectively, so as to cause the sub row circuit 104-1 (the sub row circuit coupled to the first row of the WOM array 102-1) and column circuit 106-1 (the sub column circuit coupled to the first column of the WOM array 102-1) to be selected.

In some embodiments, the control logic circuit 112 may first provide the row address and then the column address of the diagonal bit cell 200-1 to the row decoder 104' and column decoder 106', respectively, to indicate the diagonal bit cell 200-1 is disposed at the intersection of row 1 and column 1. In some other embodiments, the control logic circuit 112 may first provide the column address and then the row address of the diagonal bit cell 200-1 to the column decoder 106' and row decoder 104', respectively, or the row address to the row decoder 104' and then the column address to the column decoder 106'. Still in some other embodiments, the control logic circuit 112 may concurrently provide the column address and the row address of the diagonal bit cell 200-1 to the column decoder 106' and row decoder 104'.

Upon receiving the address combination (1, 1) of the diagonal bit cell 200-1, the row decoder 104' uses the sub row circuit 104-1 to assert the respective WL along row 1 of the WOM array 102-1 (e.g., $WL_1$ in FIG. 2A) thereby activating the bit cells along row 1. Concurrently or subsequently, the column decoder 106' uses the sub column circuit 106-1 to select the diagonal bit cell 200-1 from the bit cells along row 1 and further write a logic state (e.g., a logic 1)

to the diagonal bit cell 200-1 through the respective BL along column 1 of the WOM array 102-1 (e.g., $BL_1$ in FIG. 2A). After writing such a logic 1 to the diagonal bit cell 200-1, in some embodiments, the control logic circuit 112 may use the output circuit 108 (FIG. 1) to read out the logic state of the diagonal bit cell 200-1 to determine whether the logic 1 is successfully written to the diagonal bit cell 200-1. As such, the control logic circuit 112 can determine that the sub row circuit 104-1 and the sub column circuit 106-1 function properly, respectively, when the diagonal bit cell 200-1 is successfully written with the logic 1 (burned). Accordingly, the control logic circuit 112 may confidently determine that the sub row circuit 104-1 and the sub column circuit 160-1 can each provide a fair test for each of the remaining bit cells along row 1 and column 1, respectively.

In some embodiments, following the above operation used to burn the diagonal bit cell 200-1 for testing the sub row circuit 104-1 and sub column circuit 106-1, other sub row circuits (104-2, 104-3, 104-5, 104-6, etc.) of the row circuit 104 and sub column circuits (106-2, 106-3, 106-4, 106-5, etc.) of the column circuit 106 can be similarly tested by burning a corresponding bit cell (200-1, 200-3, 200-4, 200-5, etc.). Thus, discussions of the tests on other sub row circuits (104-2, 104-3, 104-5, 104-6, etc.) of the row circuit 104 and sub column circuits (106-2, 106-3, 106-4, 106-5, etc.) of the column circuit 106 are not repeated here.

Referring now to the WOM array 102-2 of FIG. 2B where rows are more than columns ($j_2 > k_2$), the control logic circuit 112 burns two or more sets of diagonal bit cells, e.g., 210, 212, 214, etc., of the WOM array 102-2 to test the row circuit 104 and the column circuit 106, in accordance with some embodiments. In the illustrated embodiment of FIG. 2B, when $j_2 > k_2$, the control logic circuit 112 first determines that the set of diagonal bit cells 210 are diagonal bit cells along a first diagonal 210' in the WOM array 102-2 wherein the first diagonal extends from a first row ("row 1") to a first intermediate row ("row $k_2$") and from a first column ("column 1") to a last column ("column $k_2$"); then determines that the set of diagonal bit cells 212 are diagonal bit cells along a second diagonal 212' in the WOM array 102-2 wherein the second diagonal 212' extends from a second intermediate row ("row $k_2+1$") to a third intermediate row ("row $2k_2$") and again from column 1 to the last column (column $k_2$); and determines that the set of diagonal bit cells 214 are diagonal bit cells along a third diagonal 214' in the WOM array 102-2 wherein the third diagonal 214' extends from a fourth intermediate row ("row $2k_2+1$") to a last row ("row $j_2$" or "row $2k_2+3$" in this example) and from column 1 again to an intermediate column ("column 3" in this example).

In some embodiments, the set of diagonal bit cells 210 include: diagonal bit cells 210-1, 210-2, 210-3, and 210-$k_2$; the set of diagonal bit cells 212 include: diagonal bit cells 212-1, 212-2, and 212-$k_2$; and the set of diagonal bit cells 214 include: diagonal bit cells 214-1, 214-2, and 214-3. Any desired number of diagonal bits cells can be included in each of the sets of diagonal bit cells 210, 212, and 214 while remaining within the scope of the present disclosure. It is noted that the set of diagonal bit cells 210 include a total number of $k_2$ diagonal bit cells, the set of diagonal bit cells 212 also include a total number of $k_2$ diagonal bit cells, and the set of diagonal bit cells 214 include a total number of 3 diagonal bit cells. In some embodiments, such a number of diagonal bit cells in a last set of diagonal bit cells (e.g., 214) corresponds to a remainder after division of $j_2$ by $k_2$, typically known as ($j_2 \% k_2$) or ($j_2$ mod $k_2$).

More specifically, the diagonal bit cell 210-1 of the set of diagonal bit cells 210 is disposed at an intersection of row 1 and column 1 of the WOM array 102-2 thereby having a respective address combination as (1, 1), and along the first diagonal 210', the diagonal bit cells 210-2, 210-3, and 210-$k_2$ have respective address combinations as (2, 2), (3, 3), and ($k_2$, $k_2$). The first diagonal bit cell 212-1 of the set of diagonal bit cells 212 is disposed at an intersection of row $k_2+1$, which is a next subsequent row to the last row of the first diagonal 210', and column 1 of the WOM array 102-2 thereby having a respective address combination as ($k_2+1$, 1). And along the second diagonal 212', the diagonal bit cells 212-2 and 212-$k_2$ have respective address combinations as ($k_2+2$, 2) and ($2 \times k_2$, $k_2$). The first diagonal bit cell 214-1 of the set of diagonal bit cells 214 is disposed at an intersection of row $2 \times k_2+1$, which is a next subsequent row to the last row of the second diagonal 212', and column 1 of the WOM array 102-2 thereby having a respective address combination as ($2 \times k_2+1$, 1). And along the third diagonal 214', the diagonal bit cells 214-2 and 214-3 have respective address combinations as ($2 \times k_2+2$, 2) and ($2 \times k_2+3$, 3), wherein $2 \times k_2+3$ is equal to j in the current example. In some embodiments, a respective address combination of a last diagonal bit cell of a last set of the diagonal bit cells (e.g., 214) in the WOM array 102-2 may be expressed as: ($m \times k_2 + (j_2 \bmod k_2)$, ($j_2 \bmod k_2$)), wherein m represents a quotient after division of $j_2$ by $k_2$, and ($j_2 \bmod k_2$) represents the remainder after division of $j_2$ by $k_2$ as mentioned above. As such, $m \times k_2 + (j_2 \bmod k_2)$ is equal to $j_2$.

Similar to the operation discussed above with respect to FIG. 2A, after the control logic circuit 112 determines the respective address combination of each bit cell of the sets of diagonal bit cells 210, 212, and 214 in the WOM array 102-2 and provides such an address combination to the row circuit 104 and column circuit 106, the row decoder 104' can cause corresponding sub row circuit (e.g., 104-1, 104-2, 104-$j_2$, etc.) and sub column circuit (106-1, 106-2, 106-$k_2$, etc.) to write to logic state (e.g., a logic 1) to each diagonal bit cell of the sets of diagonal bit cells 210, 212, and 214. After writing such a logic 1 to the diagonal bit cells of the sets of diagonal bit cells 210, 212, and 214, in some embodiments, the control logic circuit 112 may use the output circuit 108 (FIG. 1) to read out the logic states of the diagonal bit cells of the sets of diagonal bit cells 210, 212, and 214 to determine whether the logic 1 is successfully written to each of the diagonal bit cells of the sets of diagonal bit cells 210, 212, and 214. Therefore, the control logic circuit 112 can determine that the sub row circuit 104-1 and the sub column circuit 106-1 function properly, respectively, when each diagonal bit cell of the sets of diagonal bit cells 210, 212, and 214 is successfully written with the logic 1 (burned).

Referring now to the WOM array 102-3 of FIG. 2C where columns are more than rows ($k_3 > j_3$), the control logic circuit 112 burns two or more sets of diagonal bit cells, e.g., 220, 222, 224, etc., of the WOM array 102-3 to test the row circuit 104 and the column circuit 106, in accordance with some embodiments. In the illustrated embodiment of FIG. 2C, when $k_3 > j_3$, the control logic circuit 112 first determines that the set of diagonal bit cells 220 are diagonal bit cells along a first diagonal 220' in the WOM array 102-3 wherein the first diagonal extends from a first row ("row 1") to a last row ("row $j_3$") and from a first column ("column 1") to a first intermediate column ("column $j_3$"); then determines that the set of diagonal bit cells 222 are diagonal bit cells along a second diagonal 222' in the WOM array 102-3 wherein the second diagonal 222' extends again from row 1 to the last row (row $k_3$) and from a second intermediate column ("column $j_3+1$") to a third intermediate column ("column $2j_3$"); and determines that the set of diagonal bit cells 224 are bit cells along a third diagonal 224' in the WOM array 102-3 wherein the third diagonal 224' extends from row 1 again to an intermediate row ("row 3" in this example) and from a fourth intermediate column ("column $2j_3+1$") to a last column ("column $k_3$" or column $2j_3+3$" in this example).

In some embodiments, the set of diagonal bit cells 220 include: diagonal bit cells 220-1, 220-2, 220-3, and 220-$j_3$; the set of diagonal bit cells 222 include: diagonal bit cells 222-1, 222-2, and 222-$j_3$; and the set of diagonal bit cells 224 include: diagonal bit cells 224-1, 224-2, and 224-3. Any desired number of diagonal bits cells can be included in each of the sets of diagonal bit cells 220, 222, and 224 while remaining within the scope of the present disclosure. It is noted that the set of diagonal bit cells 210 include a total number of $j_3$ diagonal bit cells, the set of diagonal bit cells 222 also include a total number of $j_3$ diagonal bit cells, and the set of diagonal bit cells 224 include a total number of 3 diagonal bit cells. In some embodiments, such a number of diagonal bit cells in the last set of diagonal bit cells (e.g., 224) corresponds to a remainder after division of $k_3$ by $j_3$, typically known as ($k_3\% j_3$) or ($k_3 \bmod j_3$).

More specifically, the diagonal bit cell 220-1 of the set of diagonal bit cells 220 is disposed at an intersection of row 1 and column 1 of the WOM array 102-3 thereby having a respective address combination as (1, 1), and along the first diagonal 220', the diagonal bit cells 220-2, 220-3, and up to 220-$j_3$ have respective address combinations as (2, 2), (3, 3), and ($j_3$, $j_3$). The first diagonal bit cell 222-1 of the set of diagonal bit cells 222 is disposed at an intersection of row 1 and column $j_3+1$, which is a next subsequent column to the last column of the first diagonal 220', of the WOM array 102-3 thereby having a respective address combination as (1, $j_3+1$). And along the second diagonal 222', the diagonal bit cells 222-2 and up to 212-$j_3$ have respective address combinations as (2, $j_3+2$) and ($j_3$, $2\times j_3$). The first diagonal bit cell 224-1 of the set of diagonal bit cells 224 is disposed at an intersection of row 1 and column $2\times j_3+1$, which is a next subsequent column to the last column of the second diagonal 222', of the WOM array 102-3 thereby having a respective address combination as (1, $2\times j_3+1$). And along the third diagonal 224', the diagonal bit cells 224-2 and 224-3 have respective address combinations as (2, $2\times j_3+2$) and (3, $2\times j_3+3$), wherein $2\times j_3+3$ is equal to $k_3$ in the current example. In some embodiments, a respective address combination of a last diagonal bit cell of a last set of the diagonal bit cells (e.g., 224) in the WOM array 102-3 may be expressed as: (($k_3 \bmod j_3$), $n\times j_3+(k_3 \bmod j_3$)), wherein n represents a quotient after division of $k_3$ by $j_3$, and ($k_3 \bmod j_3$) represents the remainder after division of $k_3$ by $j_3$ as mentioned above. As such, $n\times j_3+(k_3 \bmod j_3)$ is equal to $k_3$.

Similar to the operation discussed above with respect to FIGS. 2A and 2B, after the control logic circuit 112 determines the respective address combination of each diagonal bit cell of the sets of diagonal bit cells 220, 222, and 224, for example, in the WOM array 102-3 and provides such an address combination to the row circuit 104 and column circuit 106, the row decoder 104' can cause corresponding sub row circuit (e.g., 104-1, 104-2, 104-$j_3$, etc.) and sub column circuit (106-1, 106-2, 106-$k_3$, etc.) to write a logic state (e.g., a logic 1) to each diagonal bit cell of the sets of diagonal bit cells 220, 222, and 224. After writing such a logic 1 to the diagonal bit cells of the sets of diagonal bit cells 220, 222, and 224, in some embodiments, the control logic circuit 112 may use the output circuit 108 (FIG. 1) to read out the logic states of the diagonal bit cells of the sets of diagonal bit cells 220, 222, and 224 to determine whether the logic 1 is successfully written to each of the diagonal bit cells of the sets of diagonal bit cells 220, 222, and 224. Therefore, the control logic circuit 112 can determine that the sub row circuit 104-1 and the sub column circuit 106-1 function properly, respectively, when each diagonal bit cell of the sets of diagonal bit cells 220, 222, and 224 is successfully written with the logic 1 (burned).

Figure 3:
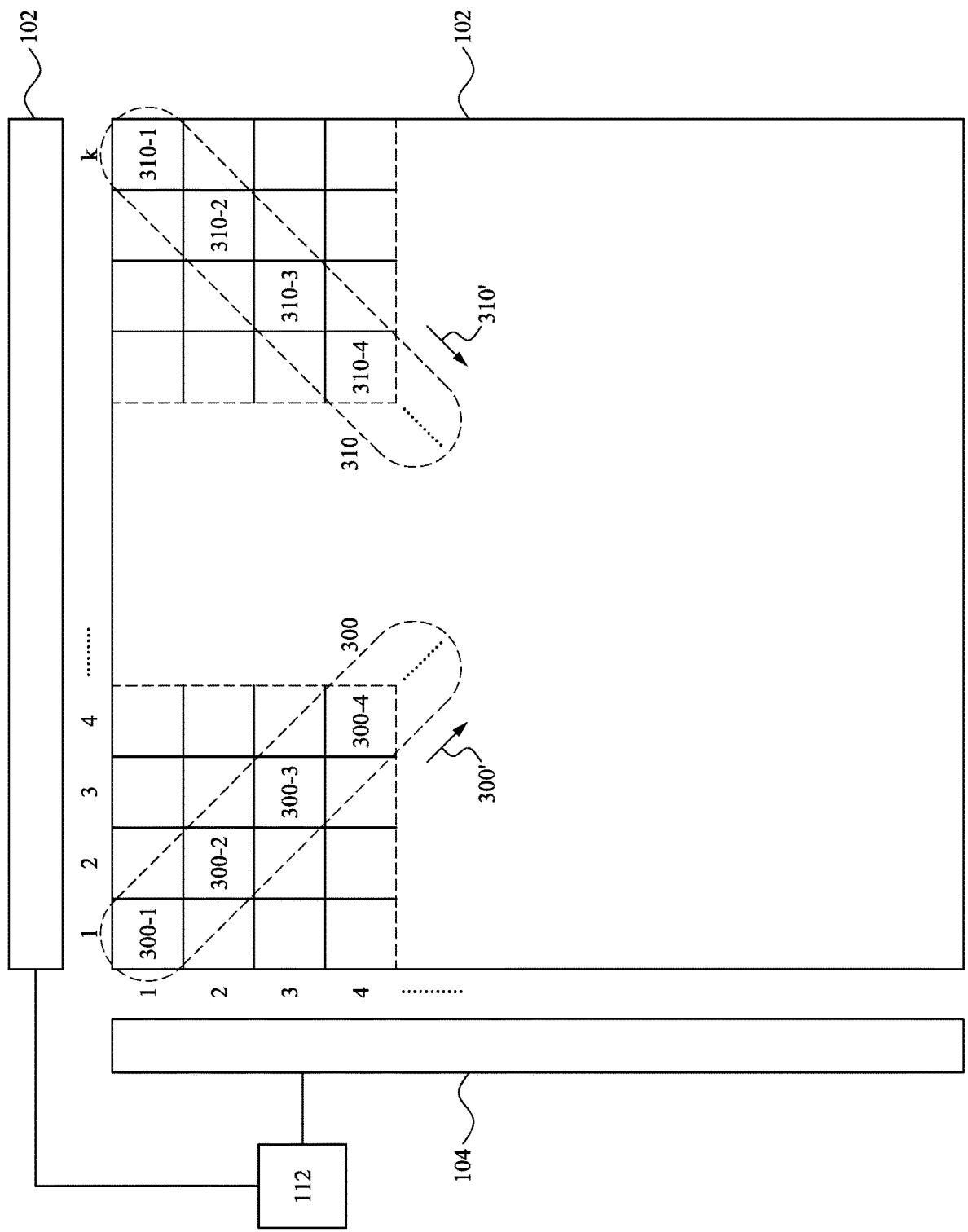
FIG. 3 illustrates an alternative block diagram of part of the WOM device 100 of FIG. 1 when at least two sets of diagonal bit cells of an included WOM array 102 are burned for testing respective peripheral circuits, in accordance with some embodiments.

FIG. 3 illustrates an alternative block diagram of part of the WOM device 100 when the control logic circuit 112 burns at least two sets of diagonal bit cells 300 and 310 of the WOM array 102 that are along respective different diagonal directions, in accordance with some embodiments. As shown, the set of diagonal bit cells 300 includes diagonal bit cells, e.g., 300-1, 300-2, 300-3, 300-4, etc., arranged along diagonal 300'; and the set of diagonal bit cells 300 includes diagonal bit cells, e.g., 310-1, 310-2, 310-3, 310-4, etc., arranged along diagonal 310', wherein the diagonals 300' and 310' are opposite to each other according to some embodiments. Burning the diagonal bit cells along respective different diagonals may provide various advantages for testing the row circuit 104 and the column circuit 106. For example, when the size of the WOM array 102 becomes larger, the row circuit 104 and/or the column circuit 106 may be only able to provide a weaker signal to one or more corner bit cells due to a signal drop present, or even accumulated, along a respective WL or BL. This may be due to the physical aspect of the wire, for example. With larger array a longer wire is used to cover all rows and columns. Due to the longer length of the wire there is a voltage or current drop across the wire. So the furthest cell from the row driver or column driver may not receive the same voltage or current as the cell the is closest to the drivers. Burning the bit diagonal cells along respective different diagonals may accordingly solve this issue. For example, given a second diagonal line the furthest cell on a row or column becomes the closest cell for that row or column. As illustrated in FIG. 3, the cell 310-1 is the furthest cell on row 1 but the closest cell on the same row 1.

Figure 4A:
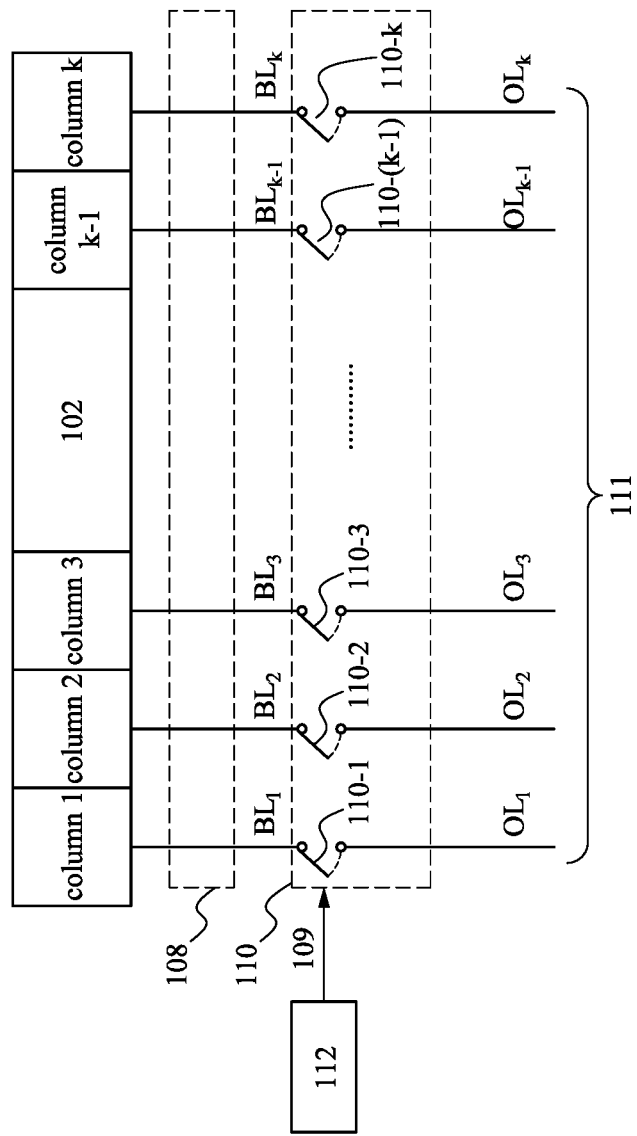
FIGS. 4A and 4B respectively illustrate a schematic diagram and an exemplary circuit diagram of a data selection circuit of the WOM device of FIG. 1, in accordance with some embodiments.
Figure 4B:
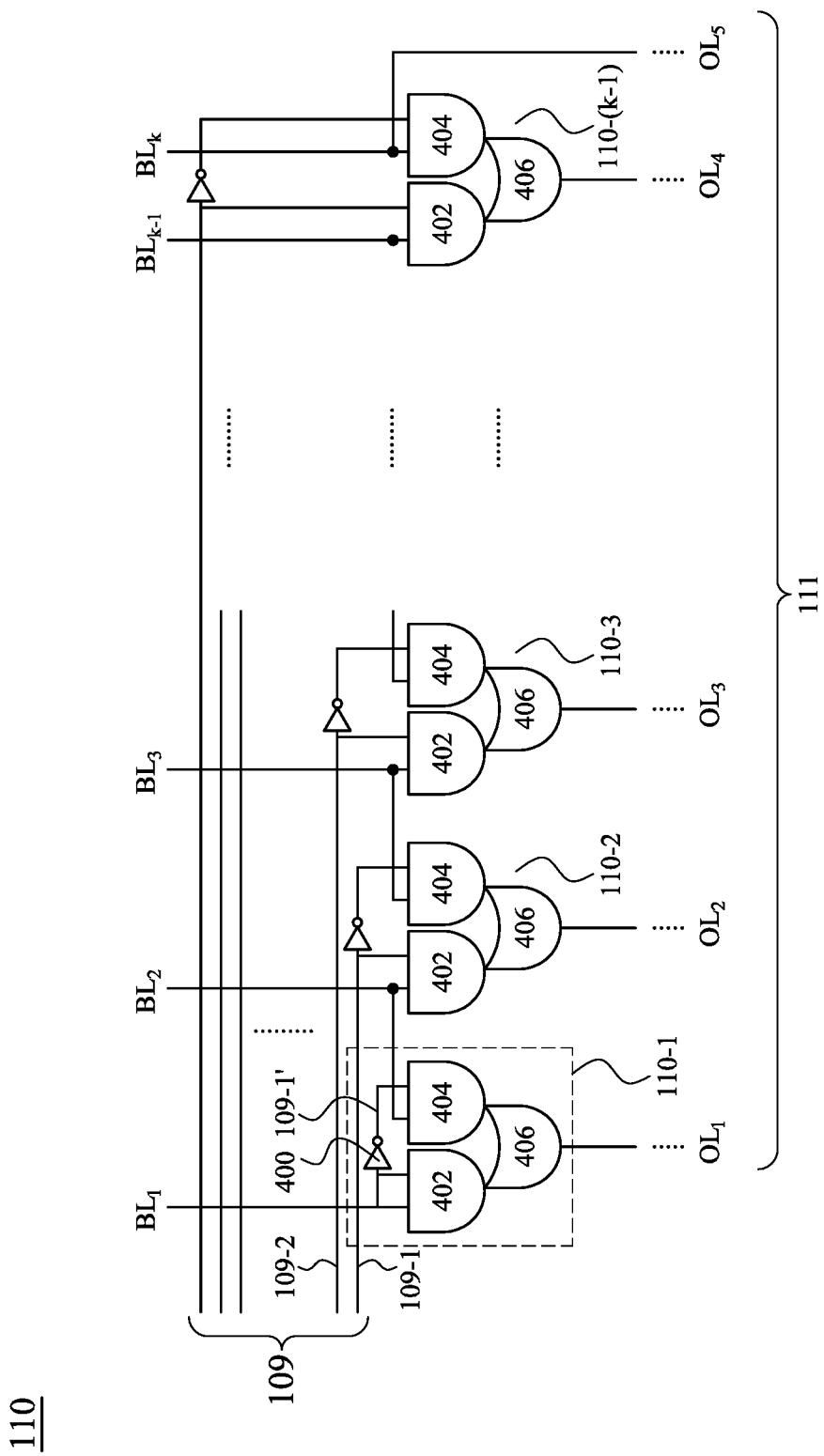

FIG. 4A illustrates a schematic diagram of the data selection circuit 110, and FIG. 4B illustrates an exemplary circuit diagram of the data selection circuit 110, in accordance with some embodiments. As mentioned above, the data selection circuit 110 is configured to skip outputting the logic states of the unusable bit cells (i.e., the burned bit cells) in the WOM array 102 based on the signal 109.

In some embodiments, the data selection circuit 110 includes a plurality of switches, e.g., 110-1, 110-2, 110-3, 110-($k-1$), and 110-$k$. Each of the switches 110-1 to 110-$k$ is coupled to a corresponding BL. For example, in FIG. 4A, the switch 110-1 is coupled to $BL_1$ (along column 1 of the WOM array 102); the switch 110-2 is coupled to $BL_2$ (along column 2 of the WOM array 102); the switch 110-3 is coupled to $BL_3$ (along column 3 of the WOM array 102); the switch 110-($k-1$) is coupled to $BL_{k-1}$ (along column $k-1$ of the WOM array 102); and the switch 110-$k$ is coupled to $BL_k$ (along column $k$ of the WOM array 102).

More specifically, each of the switches 110-1 to 110-$k$ has two ends, wherein a first end is constantly coupled to its corresponding BL as mentioned above, and a second end is either selectively coupled to a respective output line (e.g., $OL_1$, $OL_2$, $OL_3$, $OL_{k-1}$, $OL_k$, etc.) or floating (i.e., the switch is turned on/off), which causes at least one BL to be open. In some embodiments, each column's associated BL is used by the output circuit 108 to read a respective logic state of a bit cell along that column, and the associated BL is further controlled (e.g., open or coupled to an OL) by turning on or off a respective switch (e.g., 110-1 to 110-$k$). As such, the data selection circuit 110 can use the open BL to selectively skip unusable bit cell so as to provide the output signal 111 using the output lines (OL$_1$, OL$_2$, OL$_3$, OL$_{k-1}$, OL$_k$, etc). In some embodiments, the respective turning on/off behaviors of the switches (e.g., 110-1 to 110-k) are determined based on the signal 109 indicative of which of the rows in the WOM array 102 are currently read by the output circuit 108, and/or the configuration of the WOM array 102, which will be discussed in further detail below with respect to FIGS. 5A, 5B, and 5C.

In FIG. 4B, an exemplary circuit implementation of the data selection circuit 110 is illustrated. As shown, each of the switches 110-1 to 110-(k−1) includes an inverter and plural logic gates, which will be discussed below, and in some embodiments, a circuit implementation of the switch 110-k (i.e., the rightmost switch of the data selection circuit 110) is absent for design purposes. Since respective circuit implementations of the switches 110-1 to 110-(k−1) are substantially similar from one another, only the circuit implementation of the switch 100-1 is discussed.

In the illustrated embodiment of FIG. 4B, the switch 110-1 includes an inverter 400, a first AND gate 402, a second AND gate 404, and an OR gate 406. The inverter 400 is configured to receive a bit (either a logic 1 or 0), hereinafter bit 109-1, of the signal 109, and provide a logically inverted bit to the bit 109-1, hereinafter bit 109-1', to the second AND gate 404. In some embodiments, the logic state of the bit 109-1 is determined based on which of the rows in the WOM array 102 are currently read by the output circuit 108, and/or the configuration of the WOM array 102, which will be discussed below. The first AND gate 402 is configured to receive a determined logic state of a bit cell along BL$_1$ and the bit 109-1 as respective inputs, and perform an AND logic function on the respective inputs so as to provide a first AND'ed bit. The second AND gate 404 is configured to receive the bit 109-1' and a determined logic state of a bit cell along BL$_2$ (i.e., the BL next to the BL$_1$) as respective inputs, and perform the AND logic function on the respective inputs so as to provide a second AND'ed bit. The OR gate 406 is configured to receive the first and second AND' ed bits and perform an OR logic function of the first and second AND'ed bits to provide an output bit coupled to OL$_1$.

Figure 4C:
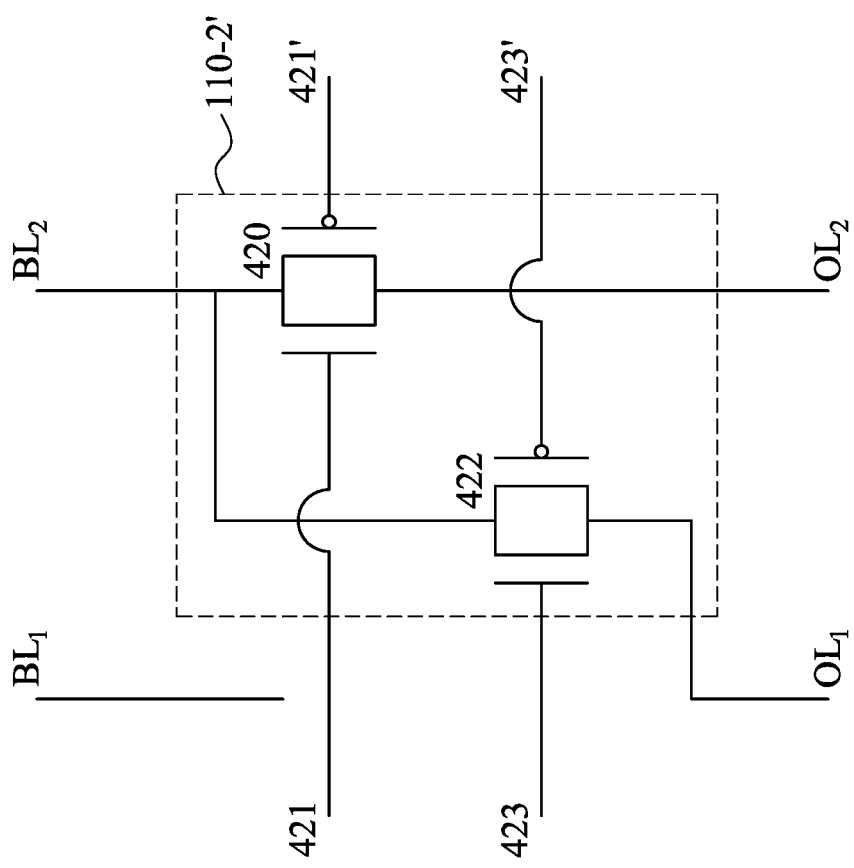
FIG. 4C illustrates a schematic diagram of a switch of the data selection circuit of the WOM device of FIG. 1, in accordance with some embodiments.

Further, in some embodiments, each of the switches 110-1 to 110-k may have three different connection states: open (i.e., not connected to any OL), connected to a corresponding OL (e.g., the switch 110-2 connects the BL$_2$ to OL$_2$), and connected to an adjacent OL (e.g., the switch 110-2 connects the BL$_2$ to OL$_1$). FIG. 4C illustrates a schematic diagram to exemplarily implement the switch 110-k, which can have such three connection states. It is noted that each of the other switches can include a circuit substantially similar to the one illustrated in FIG. 4C. In the illustrated embodiment of FIG. 4C, the switch 110-2 includes a first pass gate, or transmission gate, 420 and a second pass gate 422, wherein inputs of the first pass gate 420 and second pass gate 422 are commonly coupled to the BL$_2$, and respective outputs of the first pass gate 420 and second pass gate 422 are respectively coupled to the OL$_2$ and OL$_1$. Further, the first pass gate 420 is configured to receive an enable signal 421 to determine whether to "allow" a signal conducted from the BL$_2$ to the OL$_2$ (i.e., connecting the BL$_2$ to the OL$_2$), and the second pass gate 422 is configured to receive an enable signal 423 to determine whether to "allow" a signal conducted from the BL$_2$ to the OL$_1$ (i.e., connecting the BL$_2$ to the OL$_1$). It is also noted that the first and second pass gates 420 and 422 are configured to provide signals 421' and 423', that are logically complementary to the enable signals 421 and 423, respectively, to one or more next stage switch, e.g., 110-3. In some embodiments, the enable signals 421 and 423 may correspond to the signals 109-2 and 109-1 (FIG. 4B), respectively. To operate the switch 110-2, when the enable signals 421 and 423 are respectively the logic 1 and logic 0, the switch 110-2 connects the BL$_2$ to OL$_2$; when the enable signals 421 and 423 are respectively the logic 0 and logic 1, the switch 110-2 connects the BL$_2$ to OL$_1$; and when the enable signals 421 and 423 are both the logic 0, the switch 110-2 connects the BL$_2$ to nothing.

Figure 5A:
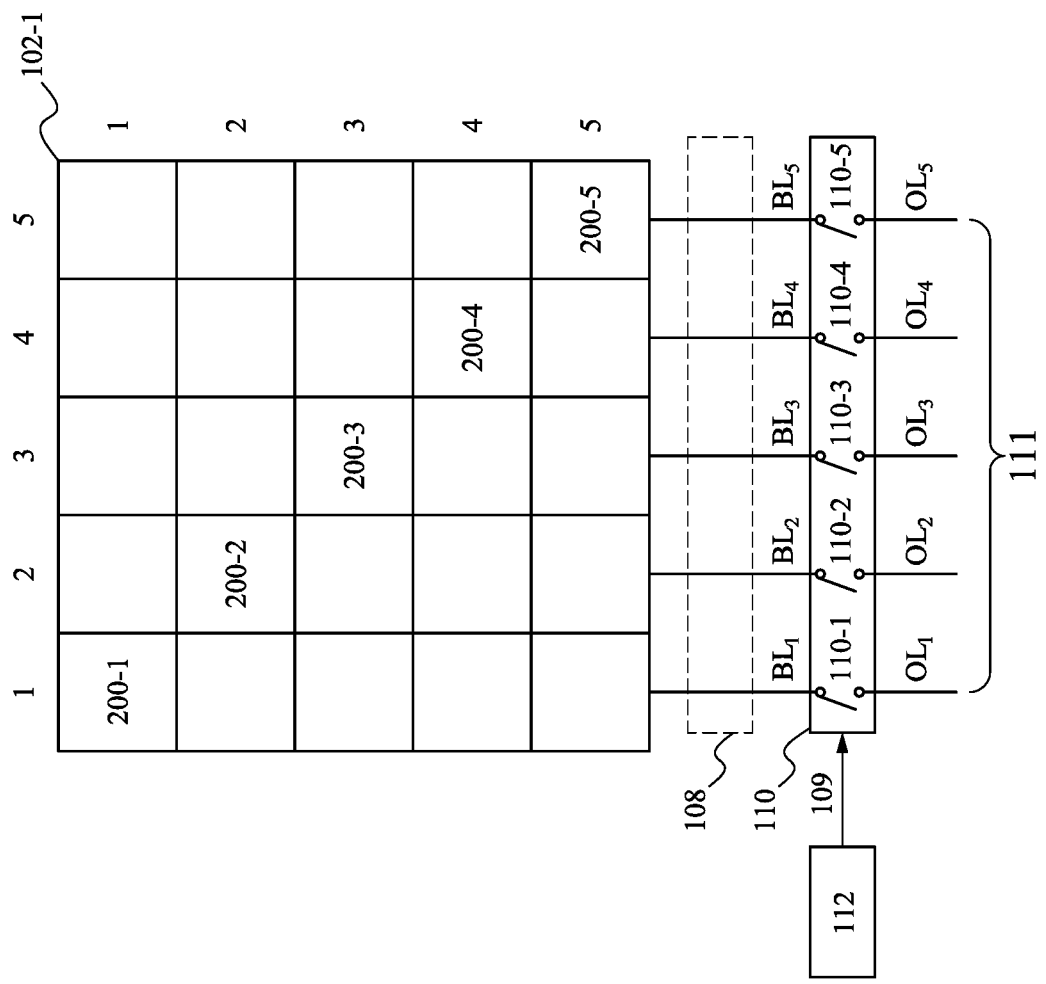
FIGS. 5A, 5B, and 5C illustrate respective schematic diagrams of part of the WOM device of FIG. 1 to explain how the data selection circuit of FIG. 4 operates when respective included WOM arrays are configured differently, in accordance with some embodiments.
Figure 5C:
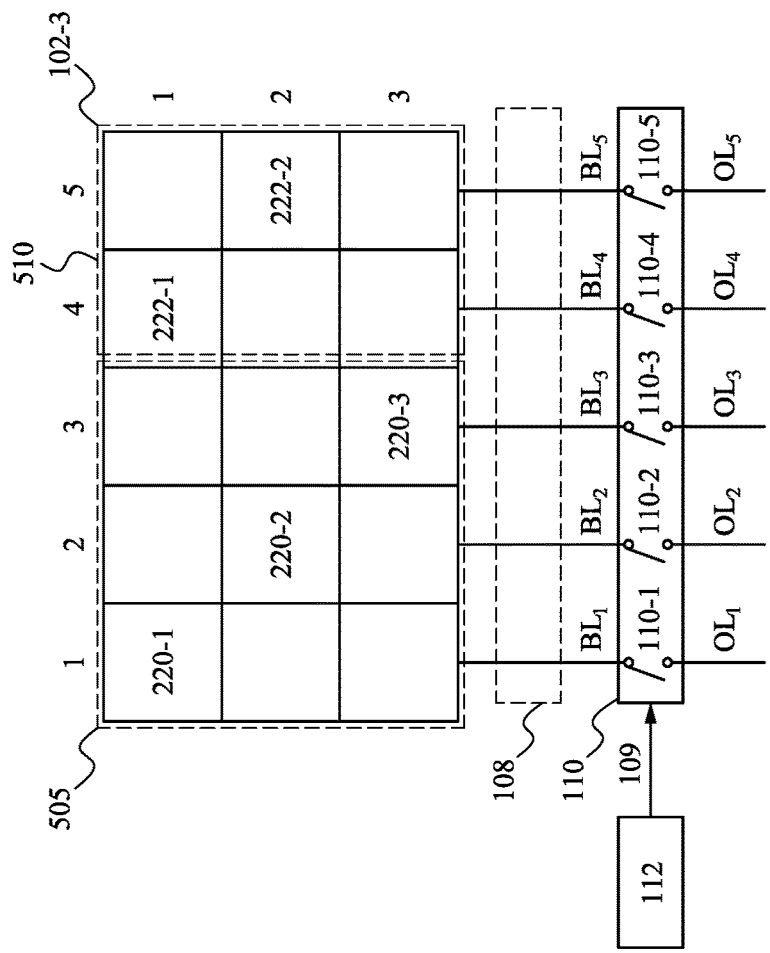
Figure 5B:
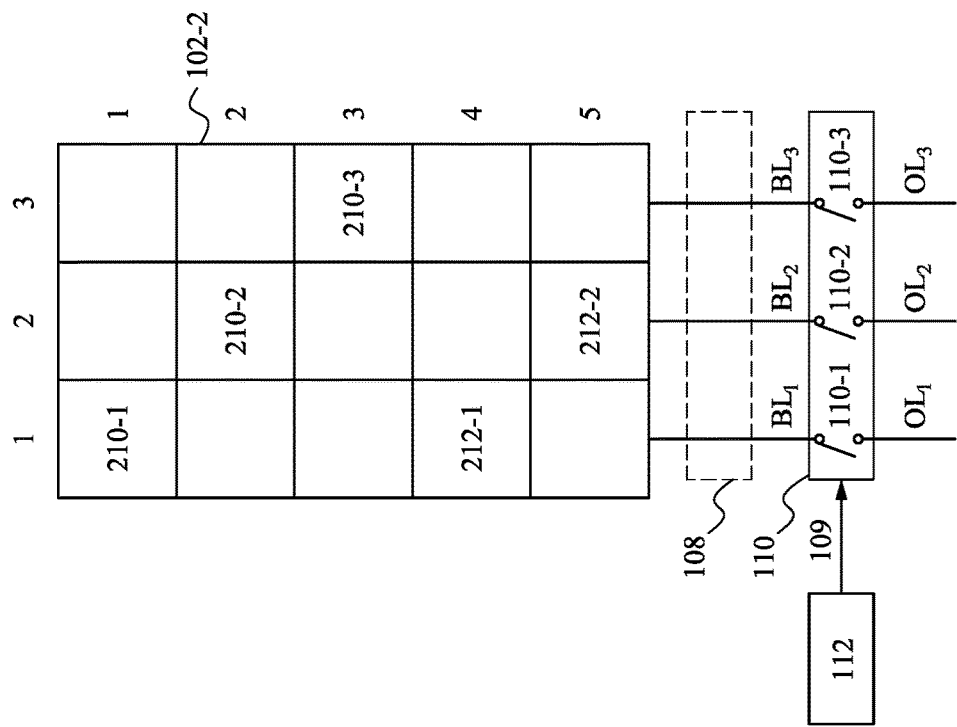

As mentioned above, the data selection circuit 110 uses the signal 109, indicating which row is asserted (read) and the configuration of the WOM array 102, to skip unusable bit cell(s). FIGS. 5A, 5B, and 5C provide respective schematic diagrams of part of the WOM device 100 to illustrate how the unusable bit cells are skipped when different WOM array configurations are used in the WOM device 100. In particular, FIG. 5A illustrates a scenario when the WOM array 102 includes equal numbers of rows and columns (e.g., the WOM array 102-1 in FIG. 2A); FIG. 5B illustrates a scenario when the WOM array 102 includes more rows than columns (e.g., the WOM array 102-2 in FIG. 2B); and FIG. 5C illustrates a scenario when the WOM array 102 includes more columns than rows (e.g., the WOM array 102-3 in FIG. 2C). It is noted that the respective WOM arrays 102-1 to 102-3 shown in FIGS. 5A-5C are simplified for purposes of illustration.

Referring first to FIG. 5A, the WOM array 102-1 has 5 rows and 5 columns, i.e., $j_1=5$ and $k_1=5$. Based on the above discussion with respect to FIG. 2A, the diagonal bit cells 200-1, 200-2, 200-3, 200-4, and 200-5 are burned to test the row circuit 104 and column circuit 106 (not shown in FIG. 5A), which causes the diagonal bit cells 200-1 to 200-5 to become unusable while keeping other bit cells usable. In some embodiments, after the test, each of the usable bits of the WOM array 102-1 may be written into a respective logic state, and the output circuit 108 reads out the written logic states of the bit cells, which may include usable and unusable bit cells, and the data selection circuit 110, based on the signal 109, skips the logic states of the unusable bit cells to be included in the output signal 111.

In some embodiments, based on the configuration of the WOM array 102-1 ($j_1=k_1$), the control logic circuit 112 may cause the signal 109 to indicate that a bit cell to be skipped for reading (i.e., the unusable bit cell) is a bit cell on a row currently being asserted and also along a column with a column address equal to a row address of the asserted row. In an example, when the bit cells along row 1 (i.e., row address=1) of the WOM array 102-1 are read, the control logic circuit 112 may provide the signal 109 indicating the diagonal bit cell 200-1 is the one to be skipped because the diagonal bit cell 200-1 is on row 1 and also along a column with a column address equal to the row address, i.e., column 1. More specifically, the signal 109 may include a plurality of bits (e.g., 109-1 in FIG. 4B) and each of the plurality of bits is to control a respective switch (e.g., 110-1 in FIG. 4B) of the data selection circuit 110. Continuing with the same example where the bit cells along row 1 are read, the signal 109 may be implemented as a cold coding, which causes only the bit 109-1 corresponding to the switch 110-1 to be the logic 0 while causing all other bits of the signal 109 to be the logic 1. Accordingly, the switch 110-1 is turned off causing the BL$_1$ to be open, and the switches 110-2, 110-3, 110-4, and 110-5 are coupled to OL$_1$, OL$_2$, OL$_3$, and OL$_4$, respectively. As such, the respective logic states of the bit cells along row 1 and along columns 2, 3, 4, and 5 can be read from $BL_2$, $BL_3$, $BL_4$, and $BL_5$ and output through $OL_1$, $OL_2$, $OL_3$, and $OL_4$, respectively, as the output signal 111.

Referring still to FIG. 5A, in another example where the bit cells along row 2 are read, the signal 109 may indicate that a bit cell on row 2 (i.e., row address=2) and also along a column with a column address equal to 2 (i.e., column 2) is the one to be skipped for reading (i.e., the bit cell 200-2). As such, in some embodiments, the signal 109 may cause a bit 109-2 (FIG. 4B) of the signal 109, corresponding to the switch 110-2, to be the logic 0 while causing all other bits of the signal 109 to be the logic 1. Accordingly, the switch 110-2 is turned off causing the $BL_2$ to be open, and the switches 110-1, 110-3, 110-4, and 110-5 are coupled to $OL_1$, $OL_2$, $OL_3$, and $OL_4$, respectively. As such, the respective logic states of the bit cells along row 2 and along columns 1, 3, 4, and 5 can be read from $BL_1$, $BL_3$, $BL_4$, and $BL_5$ and output through $OL_1$, $OL_2$, $OL_3$, and $OL_4$, respectively, as the output signal 111.

It is noted that, in accordance with some embodiments of the present disclosure, after skipping an unusable bit cell along a row, the data selection circuit 110 may shift logic states of usable bits along that row, read from respective BL's, to be output through lines $OL_1$, $OL_2$, $OL_3$, and $OL_4$. Alternatively stated, in some embodiments, the data selection circuit 110 may keep the switch 110-5 turned off and the output line $OL_5$ may not be used.

Referring then to FIG. 5B, the WOM array 102-2 has 5 rows and 3 columns, i.e., $j_2$=5 and $k_2$=3. Based on the above discussion with respect to FIG. 2B, the diagonal bit cells 210-1, 210-2, 210-3, 212-1, and 212-2 are burned to test the row circuit 104 and column circuit 106 (not shown in FIG. 5B), which causes the diagonal bit cells 210-1, 210-2, 210-3, 212-1, and 212-2 to become unusable while keeping other bit cells usable. Similarly, after the test, each of the usable bits of the WOM array 102-2 may be written into a respective logic state, and the output circuit 108 reads out the written logic states of the bit cells, which may include usable and unusable bit cells, and the data selection circuit 110, based on the signal 109, skips the logic states of the unusable bit cells to be included in the output signal 111.

In some embodiments, based on the configuration of the WOM array 102-2 ($j_2$>$k_2$), the control logic circuit 112 may cause the signal 109 to indicate that a bit cell to be skipped for reading (i.e., the unusable bit cell) is a bit cell on a row currently being asserted and along a column with a column address that is equal to a remainder of division of a row address of the currently asserted row by $k_2$. In an example, when the bit cells along row 1 (i.e., row address=1) of the WOM array 102-2 are read, the bit cell along row 1 to be skipped is the bit cell also along column 1 since the remainder of ⅓ is 1. Similarly, the signal 109 may cause one of its plural bits, corresponding to the column to be skipped, to be the logic 0 while causing all other bits of the signal 109 to be the logic 1 such that to selectively couple BL's ($BL_1$, $BL_2$, and $BL_3$ in FIG. 5B) to OL's ($OL_1$, $OL_2$, and $OL_3$ in FIG. 5B) as mentioned above.

In another example, where the bit cells of the WOM array 102-2 along row 4 (i.e., row address=4) are read, based on the above description, the signal 109 may indicate that the bit cell along row 4 to be skipped is the bit cell along column 1 (i.e., 212-1) because a remainder of 4/3 is 1. Yet in another example where the bit cells of the WOM array 102-2 along row 5 (i.e., row address=5) are read, based on the above description, the signal 109 may indicate that the bit cell along row 5 to be skipped is the bit cell along column 2 (i.e., 212-2) because a remainder of 5/3 is 2. It is noted that when a remainder is equal to 0, the signal 109 may indicate the bit cell to be skipped is along a column with a column address that is equal to the divisor, i.e., $k_2$.

Referring then to FIG. 5C, the WOM array 102-3 has 3 rows and 5 columns, i.e., $j_3$=3 and $k_3$=5. Based on the above discussion with respect to FIG. 2C, the diagonal bit cells 220-1, 220-2, 220-3, 222-1, and 222-2 are burned to test the row circuit 104 and column circuit 106 (not shown in FIG. 5C), which causes the diagonal bit cells 220-1, 220-2, 220-3, 222-1, and 222-2 to become unusable while keeping other bit cells usable. Similarly, after the test, each of the usable bits of the WOM array 102-3 may be written into a respective logic state, and the output circuit 108 reads out the written logic states of the bit cells, which may include usable and unusable bit cells, and the data selection circuit 110, based on the signal 109, skips the logic states of the unusable bit cells to be included in the output signal 111.

In some embodiments, based on the configuration of the WOM array 102-3 ($k_3$>$j_3$), the control logic circuit 112 may symbolically divide the WOM array 102-3 into plural sub WOM arrays, e.g., 505 and 510, each of which has equal numbers of rows and columns and such a number is further equal to $j_3$, for example, 505, except that one sub WOM array has $j_3$ rows and ($k_3$ mod $j_3$) columns, e.g., 510. The sub WOM array(s) with equal numbers of rows and columns are herein referred to as major sub array(s) 505; and the sub WOM array with unequal numbers of rows and columns is herein referred to as a minor sub array 510. Since respective columns numbers of the major sub array 505 and the minor sub array 510 are changed, the control logic circuit 112 may renumber column addresses of the major sub array 505's and the minor sub array 510's respective columns, according to some embodiments. For example, the minor sub array 510 becomes having two columns (columns 4 and 5 of the WOM array 102-3), wherein a first column is associated with a new column address "1" and a second column is associated with a new column address "2." In some embodiments, the control logic circuit 112 causes the signal 109 to indicate each of the major and minor sub arrays 505 and 510 includes at least one bit cell to be skipped for reading (i.e., the unusable bit cell). More specifically, a bit cell in the major sub array 505 will be skipped when such a bit cell is disposed along a column with a new column address equal to a row address of an asserted row; and a bit cell in the minor sub array 510 will be skipped when such a bit cell is disposed along a column with a new column address equal to the row address of the asserted row.

In an example where the bit cells along row 1 (i.e., row address=1) of the WOM array 102-3 are read, the control logic circuit 112 may provide the signal 109 indicating that the diagonal bit cell 220-1 is the one to be skipped in the major sub array 505 because the diagonal bit cell 220-1 is on row 1 and also along a column in the major sub array 505 with a column address equal to the row address, i.e., column 1 of the major sub array 505 (also column 1 of the WOM array 102-3), and moreover, the diagonal bit cell 222-1 is the one to be skipped in the minor sub array 510 because the diagonal bit cell 222-1 is on row 1 and also along a column in the minor sub array 510 with a "new" column address equal to the row address, i.e., column 1 of the minor sub array 510 (original column 4 of the WOM array 102-3). Similarly, the signal 109 may cause one of its plural bits, corresponding to the column to be skipped, to be the logic 0 while causing all other bits of the signal 109 to be the logic 1 such that to selectively couple BL's ($BL_1$, $BL_2$, $BL_3$, $BL_4$, and $BL_5$ in FIG. 5C) to OL's ($OL_1$, $OL_2$, $OL_3$, $OL_4$, and $OL_5$ in FIG. 5C) as mentioned above.

Figure 6:
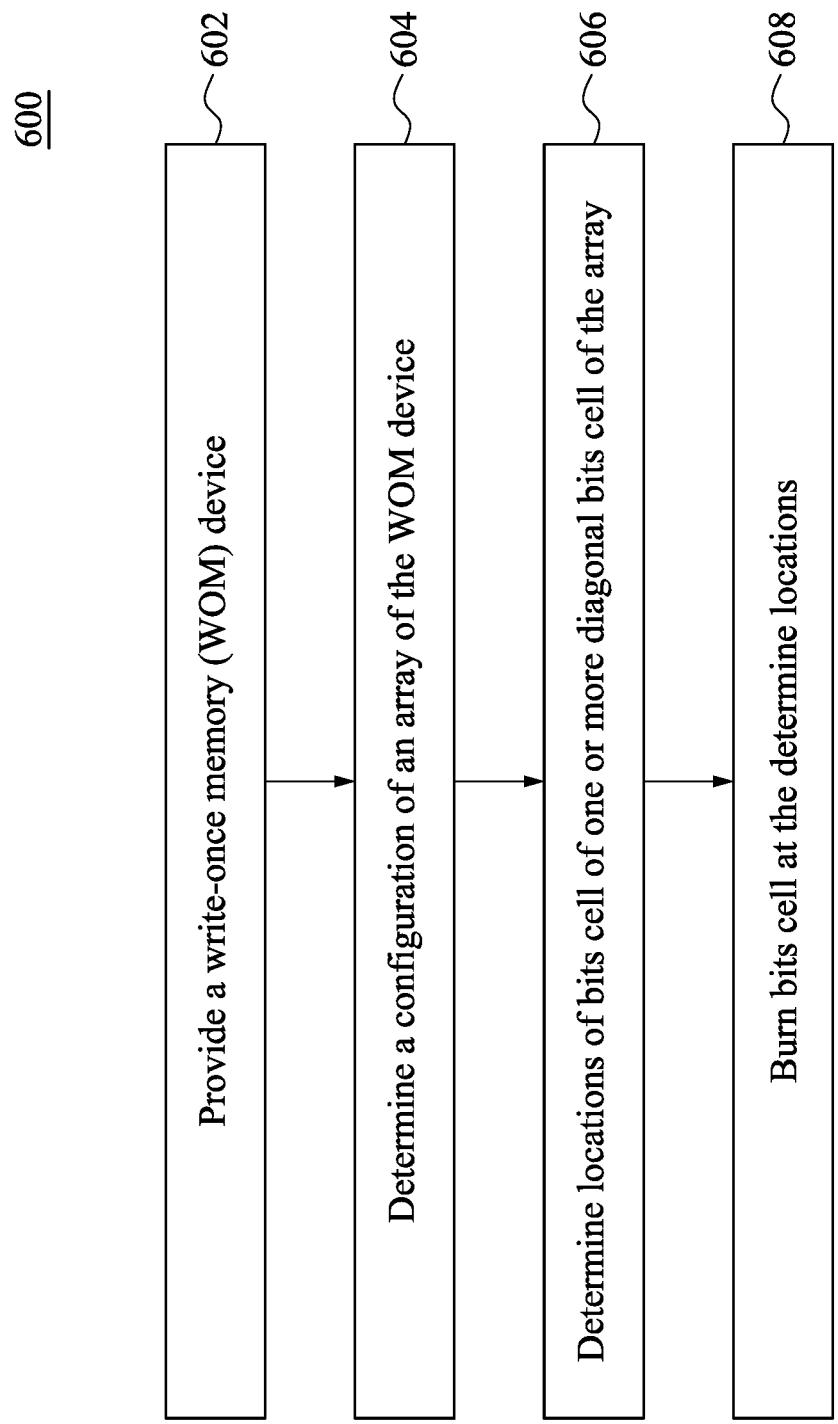
FIG. 6 illustrates a flow chart of an exemplary method to test peripheral circuits of the WOM device of FIG. 1, in accordance with some embodiments.

FIG. 6 illustrates a flow chart of an exemplary method 600 to test the row circuit 104 and column circuit 106 of the WOM device 100, in accordance with various embodiments. In various embodiments, the operations of the method 600 are performed by the respective components illustrated in FIGS. 1-5C. For purposes of discussion, the following embodiment of the method 600 will be described in conjunction with FIGS. 1-5C. The illustrated embodiment of the method 600 is merely an example. Therefore, it should be understood that any of a variety of operations may be omitted, re-sequenced, and/or added while remaining within the scope of the present disclosure.

The method 600 starts with operation 602 in which a write-once memory (WOM) device is provided, in accordance with some embodiments. In the example discussed above, the WOM device 100 includes the WOM array 102 having a plurality of write-once bit cells, where the plurality of write-once bit cells are arranged in a column-row configuration. More specifically, the WOM array 102 has a first number (e.g., $j_1$, $j_2$, and $j_3$) of rows and a second number (e.g., $k_1$, $k_2$, and $k_3$) of columns, wherein the first number and second number may be equal to or different from each other.

The method 600 continues to operation 604 in which a configuration of an array of the WOM device is determined, in accordance with some embodiments. Continuing with the same example, when the WOM array 102 is implemented as the WOM array 102-1 of FIG. 2A, the configuration of the WOM array 102-1 may be determined as an array with equal numbers of rows and columns, i.e., $j_1=k_1$. When the WOM array 102 is implemented as the WOM array 102-2 of FIG. 2B, the configuration of the WOM array 102-2 may be determined as an array with more rows than columns, i.e., $j_2>k_2$. When the WOM array 102 is implemented as the WOM array 102-3 of FIG. 2C, the configuration of the WOM array 102-3 may be determined as an array with more columns than row, i.e., $k_3>j_3$.

The method 600 continues to operation 606 in which respective locations of diagonal bit cells of one or more sets of of diagonal bit cells of the array are determined based on the configuration of the array, in accordance with some embodiments. Continuing with the same example, when the WOM array 102 is implemented as the WOM array 102-1 of FIG. 2A, such locations (e.g., a combination of row and column addresses) of the diagonal bit cells of the one or more sets of diagonal bit cells (e.g., 200) are determined as described above. When the WOM array 102 is implemented as the WOM array 102-2 of FIG. 2B, such locations of the diagonal bit cells of the one or more sets of diagonal bit cells (e.g., 210, 212, 214, etc.) are determined as described above. When the WOM array 102 is implemented as the WOM array 102-3 of FIG. 2C, such locations of the diagonal bit cells of the one or more sets of diagonal bit cells (e.g., 220, 222, 224, etc.) are determined as described above.

The method 600 continues to operation 608 in which the diagonal bit cells of the one or more sets of diagonal bit cells are burned so as to test peripheral circuits of the WOM device, in which in accordance with some embodiments. Continuing with the same example, after the locations of the diagonal bit cells of the one or more sets of diagonal bit cells are determined, each diagonal bit cell of the one or more sets of diagonal bit cells is burned by being written with the logic 1, for example, to concurrently or respectively test corresponding sub row circuit of the row circuit 014 and sub column circuit of the column circuit 106.

In an embodiment, a memory device includes: a memory array comprising a plurality of bit cells arranged along a plurality of rows and along a plurality of columns, respectively; and a control logic circuit coupled to the memory array, and configured to determine respective locations of a first plurality of diagonal bit cells of the memory array for testing one or more peripheral circuits coupled to the memory array.

In another embodiment, a memory device includes: a memory array comprising a plurality of bit cells arranged along a plurality of rows and along a plurality of columns, respectively; a plurality of row circuits respectively arranged along the plurality of rows; a plurality of column circuits respectively arranged along the plurality of columns; and a control logic circuit coupled to the memory array, and configured to determine respective locations of a first plurality of diagonal bit cells of the memory array for testing the pluralities of the row and column circuits.

Yet in another embodiment, a method includes: providing a write-once memory array comprising a plurality of write-once bit cells arranged along a plurality of rows and along a plurality of columns, respectively; determining respective locations of a first plurality of diagonal write-once bit cells of the write-once memory array based on respective numbers of the pluralities of rows and columns; and burning the first plurality of diagonal write-once bit cells for testing one or more peripheral circuits coupled to the write-once memory array.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory array comprising a plurality of bit cells arranged along a plurality of rows and along a plurality of columns, respectively; and
a control logic circuit coupled to the memory array, and configured to determine respective locations of a first plurality of diagonal bit cells of the memory array for testing one or more peripheral circuits coupled to the memory array,
wherein the control logic circuit is configured to determine the respective locations of the first plurality of diagonal bit cells further based on respective numbers of the plurality of rows and the plurality of columns and
when the number of the plurality of rows is larger than the number of the plurality of columns, the respective locations of the first plurality of diagonal bit cells span from a first row to a first intermediate row of the plurality of rows, and from a first column to a last column of the plurality of columns, wherein the first intermediate row is associated with a first row number equal to the number of the plurality of columns.

2. The device of claim 1, wherein each of the plurality of bit cells comprises a write-once memory (WOM) bit cell.

3. The device of claim 1, wherein the one or more peripheral circuits comprise a plurality of row circuits each configured to assert at least one of the plurality of rows, and a plurality of column circuits each configured to assert at least one of the plurality of columns.

4. The device of claim 1, wherein in response to the respective locations of the first plurality of diagonal bit cells being determined, the control logic circuit is further configured to cause each of the first plurality of diagonal bit cells to be burned for testing the one or more peripheral circuits.

5. The device of claim 1, wherein a number of the plurality of rows is different than a number of the plurality of columns and the first plurality of diagonal bit cells span an equal number of rows and columns.

6. The device of claim 1, wherein when the number of the plurality of rows is equal to the number of the plurality of columns, the respective locations of the first plurality of diagonal bit cells span from a first row to a last row of the plurality of rows, and from a first column to a last column of the plurality of columns.

7. The device of claim 1, wherein the control logic circuit is further configured to determine respective locations of at least a second plurality of diagonal bit cells of the memory array for testing the one or more peripheral circuits, and wherein the second plurality of diagonal bit cells span from the first row to a second intermediate row of the plurality of rows, and from the first column to the last column of the plurality of columns, wherein the second intermediate row is associated with a second row number greater than the number of the plurality of columns.

8. The device of claim 1, wherein when the number of the plurality of rows is smaller than the number of the plurality of columns, the respective locations of the first plurality of diagonal bit cells span from a first row to a last row of the plurality of rows, and from a first column to a first intermediate column of the plurality of columns, wherein the first intermediate column is associated with a first column number equal to the number of the plurality of rows.

9. The device of claim 8, wherein the control logic circuit is further configured to determine respective locations of at least a third plurality of diagonal bit cells of the memory array for testing the one or more peripheral circuits, and wherein the third plurality of diagonal bit cells span from the first row to the last row of the plurality of rows, and from the first column to second intermediate column of the plurality of columns, wherein the second intermediate column is associated with a second column number greater than the number of the plurality of rows.

10. A memory device, comprising:
a memory array comprising a plurality of bit cells arranged along a plurality of rows and along a plurality of columns, respectively;
a plurality of row circuits respectively arranged along the plurality of rows;
a plurality of column circuits respectively arranged along the plurality of columns; and
a control logic circuit coupled to the memory array, and configured to determine respective locations of a first plurality of diagonal bit cells of the memory array for testing the pluralities of the row and column circuits, wherein the control logic circuit is configured to determine the respective locations of the first plurality of diagonal bit cells further based on respective numbers of the plurality of rows and the plurality of columns, wherein a number of the plurality of rows is different than a number of the plurality of columns and the first plurality of diagonal bit cells span an equal number of rows and columns.

11. The device of claim 10, wherein each of the plurality of bit cells comprises a write-once memory (WOM) bit cell.

12. The device of claim 10, wherein each of the plurality of row circuits is configured to assert at least one of the plurality of rows, and each of the plurality of column circuits is configured to assert at least one of the plurality of columns.

13. The device of claim 10, wherein in response to the respective locations of the first plurality of diagonal bit cells being determined, the control logic circuit is further configured to cause each of the first plurality of diagonal bit cells to be burned for testing the pluralities of the row and column circuits.

14. The device of claim 10, wherein the control logic circuit includes a built-in self-test (BIST) circuit coupled to the plurality of row circuits and the plurality of column circuits to provide respective address information.

15. The device of claim 14, wherein when the number of the plurality of rows is larger than the number of the plurality of columns, the respective locations of the first plurality of diagonal bit cells span from a first row to a first intermediate row of the plurality of rows, and from a first column to a last column of the plurality of columns, wherein the first intermediate row is associated with a first row number equal to the number of the plurality of columns.

16. The device of claim 15, wherein the control logic circuit is further configured to determine respective locations of at least a second plurality of diagonal bit cells of the memory array for testing the pluralities of the row and column circuits, and wherein the second plurality of diagonal bit cells span from the first row to a second intermediate row of the plurality of rows, and from the first column to the last column of the plurality of columns, wherein the second intermediate row is associated with a second row number greater than the number of the plurality of columns.

17. The device of claim 14, wherein when the number of the plurality of rows is smaller than the number of the plurality of columns, the respective locations of the first plurality of diagonal bit cells span from a first row to a last row of the plurality of rows, and from a first column to a first intermediate column of the plurality of columns, wherein the first intermediate column is associated with a first column number equal to the number of the plurality of rows.

18. A method, comprising:
providing a write-once memory array comprising a plurality of write-once bit cells arranged along a plurality of rows and along a plurality of columns, respectively;
determining respective locations of a first plurality of diagonal write-once bit cells of the write-once memory array based on respective numbers of the pluralities of rows and columns, wherein when the number of the plurality of rows is larger than the number of the plurality of columns, the respective locations of the first plurality of diagonal bit cells span from a first row to a first intermediate row of the plurality of rows, and from a first column to a last column of the plurality of columns, wherein the first intermediate row is associated with a first row number equal to the number of the plurality of columns; and
burning the first plurality of diagonal write-once bit cells for testing one or more peripheral circuits coupled to the write-once memory array.

19. The method of claim 18, wherein a number of the plurality of rows is different than a number of the plurality of columns and the first plurality of diagonal write-once bit cells span an equal number of rows and columns.

20. The method of claim 18, wherein when the number of the plurality of rows is equal to the number of the plurality of columns, the respective locations of the first plurality of diagonal bit cells span from a first row to a last row of the plurality of rows, and from a first column to a last column of the plurality of columns.

* * * * *